US010802790B2

(12) United States Patent
Itoh et al.

(10) Patent No.: US 10,802,790 B2
(45) Date of Patent: Oct. 13, 2020

(54) PORTABLE COMPUTING DEVICES AND COMMAND INPUT METHODS FOR THE PORTABLE COMPUTING DEVICES

(71) Applicant: LENOVO (Singapore) PTE. LTD., New Tech Park (SG)

(72) Inventors: Hiroshi Itoh, Yokohama (JP); Jun Luo, Yokohama (JP)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 84 days.

(21) Appl. No.: 16/033,933

(22) Filed: Jul. 12, 2018

(65) Prior Publication Data

US 2019/0018642 A1    Jan. 17, 2019

(30) Foreign Application Priority Data

Jul. 12, 2017  (JP) .................................. 2017-136538

(51) Int. Cl.
| | |
|---|---|
| *G06F 3/16* | (2006.01) |
| *G06F 3/043* | (2006.01) |
| *H03G 3/04* | (2006.01) |
| *H04M 1/725* | (2006.01) |
| *H03G 3/32* | (2006.01) |
| *G06F 3/0488* | (2013.01) |

(52) U.S. Cl.
CPC .............. *G06F 3/165* (2013.01); *G06F 3/043* (2013.01); *G06F 3/04883* (2013.01); *G06F 3/167* (2013.01); *H03G 3/04* (2013.01); *H03G 3/32* (2013.01); *H04M 1/72519* (2013.01); *H04M 2250/22* (2013.01)

(58) Field of Classification Search
None
See application file for complete search history.

(56) References Cited

U.S. PATENT DOCUMENTS

| | | | |
|---|---|---|---|
| 2010/0137027 A1* | 6/2010 | Kim .................... | G06F 3/03547 455/556.1 |
| 2011/0013785 A1* | 1/2011 | Kim ........................ | H03G 3/32 381/107 |
| 2011/0096036 A1* | 4/2011 | McIntosh ................ | G06F 3/043 345/177 |
| 2015/0212639 A1* | 7/2015 | Wallace .............. | G06F 3/04883 345/173 |
| 2015/0326985 A1* | 11/2015 | Priyantha ........... | G06K 9/00355 381/56 |
| 2017/0147188 A1* | 5/2017 | Rong .................. | G06F 3/04815 |
| 2018/0343513 A1* | 11/2018 | Simms ................... | H04R 1/083 |
| 2018/0348853 A1* | 12/2018 | Shchur ..................... | G06F 3/16 |

FOREIGN PATENT DOCUMENTS

| | | |
|---|---|---|
| JP | 2009/230175 A | 10/2009 |
| JP | 2011-254188 A | 12/2011 |
| JP | 2015005136 A | 1/2015 |

* cited by examiner

*Primary Examiner* — Qin Zhu
(74) *Attorney, Agent, or Firm* — Kunzler Bean & Adamson

(57) ABSTRACT

Methods for inputting commands to portable computing devices are disclosed. One method includes detecting a sound, analyzing attenuation of the detected sound in a predetermined frequency, and inputting a command to a portable computing device based on analysis of the detected sound. Apparatus and computer program products implementing the methods are also disclosed.

20 Claims, 9 Drawing Sheets

PORTABLE COMPUTING DEVICES AND COMMAND INPUT METHODS FOR THE PORTABLE COMPUTING DEVICES

CROSS-REFERENCE TO RELATED APPLICATIONS

This patent application claims priority to Japan Patent Application No. JP2017-136538, filed on 12 Jul. 2017 by Itoh, et al., the entire contents of which are incorporated herein by reference for all purposes.

FIELD

The present disclosure relates to portable computing devices, command input methods for the portable computing devices, and computer program products for imputing commands to a portable computing device.

BACKGROUND

In recent years, portable computing devices equipped with touch display units, such as smartphones and so forth, have spread through the market. The following examples are methods of user input methods for such portable computing devices.

A first example includes a method of inputting a command by touching or tapping a screen. In this method, a touch sensor is used to detect screen touching or tapping. Here, it is necessary to bring a finger, a pen, a stylus, etc., and so forth into direct contact with the screen. Therefore, in situations in which the portable computing device is put in a pocket of an article of clothing, it is impossible to operate the portable computing device because the pocket prevents direct contact with the screen (through fibers).

A second example includes a method of inputting a voice command. In this method, a user's voice is detected by a microphone and the voice is recognized using a voice recognition technique. There are cases in which using this method may be troubling because some environments include other people in addition to the user, and therefore it is difficult to use this method in an environment in which the user is not alone (e.g., in a conference, on the train, etc., and so forth).

A third example includes an input method utilizing a gesture with the device. In this method, motion of the device is detected by a sensor and the input is entered based on the detected motion of the device. In this method, it is necessary for the user to brandish the device by having the device in his/her hand, and therefore this method is inconvenient in a place with limited or no space.

SUMMARY

Various embodiments provide methods, apparatus, and computer program products for imputing commands to a portable computing device. One method includes detecting a sound (e.g., a human voice), analyzing attenuation of the detected sound in a predetermined frequency, and inputting a command to a portable computing device based on analysis of the detected sound.

An apparatus includes a microphone configured to detect a sound, an analysis unit configured to analyze attenuation of the detected sound in a predetermined frequency, and a command input unit configured to input a volume command based on analysis of the detected sound by the analysis unit. In various embodiments, at least a portion of the units include one or more of a set of hardware circuits, a set of programmable hardware devices, and/or executable code stored on a set of non-transitory computer-readable storage mediums.

One computer program product includes a computer-readable storage medium including program instructions embodied therewith. The program instructions are executable by a processor and cause the processor to receive a sound detected by a microphone, analyze attenuation of the detected sound in a predetermined frequency, and input a volume command to a portable computing device based on analysis of the detected sound.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
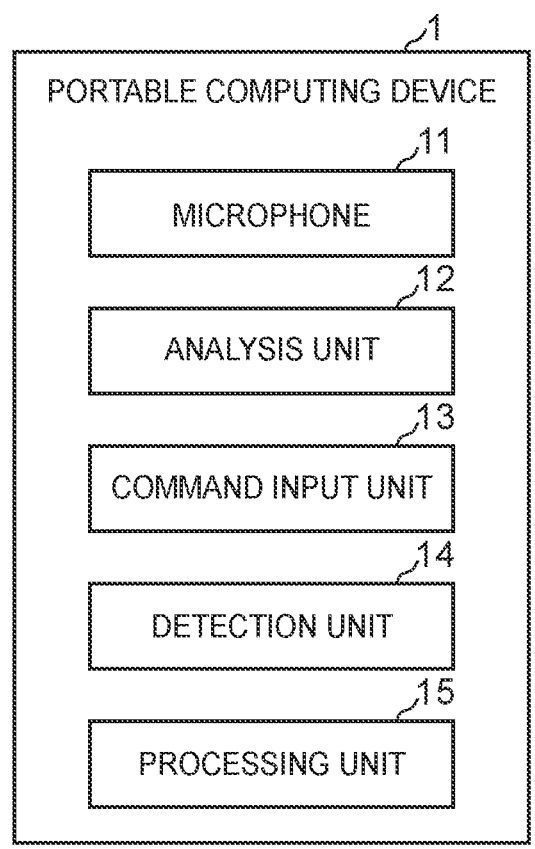
FIG. 1 is a block diagram illustrating one example of a portable computing device according to one embodiment of the present technology.

The present disclosure is made in view of the above-described circumstances and aims to provide a portable computing device that makes it possible to input a command in a state of putting the device in a pocket of an article of clothing and so forth without troubling surrounding people, a command input method for the portable computing device, and a computer executable program for the command input method.

To solve the above-described issue and to attain the above-described aims, a portable computing device according to a first aspect of the present technology includes a microphone configured to input a sound, an analysis unit configured to analyze attenuation of the sound that is input from the microphone in a predetermined frequency band, and a command input unit configured to input a command based on an analysis of the inputs by the analysis unit.

In addition, the analysis unit may analyze the attenuation of the input sound in the predetermined frequency band and determine a direction that a user swipes the portable computing device with his/her finger relative to the microphone, and the command input unit may input the command corresponding to the direction in which the swiping is performed with the finger relative to the microphone.

Further, the command input unit may input commands that are different from each other between a situation in which the direction that the user swipes the portable computing device with his/her finger relative to the microphone is a direction that the finger approaches the microphone and a situation in which the direction in which the user swipes the portable computing device with his/her finger relative to the microphone is a direction that the finger moves away from the microphone.

In addition, the portable computing device further includes a detection unit configured to detect a tapping operation performed on the portable computing device, and the command input unit may input the command based on detecting the tapping operation by the detection unit.

Further, the command input unit may input a command that corresponds to a combination of the result of an analysis performed by the analysis unit combined with the result detected by the detection unit.

In addition, to solve the above-described issues and to attain the above-described aims, a command input method for the portable computing device according to a second aspect of the present technology includes analyzing attenuation of a sound that is input from a microphone within a predetermined frequency band and inputting a command based on the analysis.

Moreover, to solve the above-described issues and to attain the above-described aims, a computer-executable program that is loaded on the portable computing device according to a third aspect of the present technology causes a computer to analyze attenuation of a sound that is input from a microphone within a predetermined frequency band and input a command based on analysis.

According to the above-described aspects of the present technology, it becomes possible to input the command in a state of putting the portable computing device in a pocket of clothing without disturbing surrounding people. In the following, a portable computing device, a command input method, and a computer-executable program are described with reference to the accompanying drawings. Although various elements of the present technology are generally illustrated in the drawings and described in the specification, it is understood that the various elements may be arranged and designed widely and diversely in various other configurations, each of which is included herein. Accordingly, the following more detailed description on specific embodiments of the device, the method, and the program of the present technology does not limit the range of the present technology described in the claims and merely indicates examples of the selected embodiments of the present technology, and simply indicates the embodiments selected for the device, the method, and the program with no conflict with the present technology described in the claims. A person skilled in the art would understand that it is possible to achieve the present technology even when one or more specific items are omitted or produced by other methods, components, and/or materials. In addition, the order of executing respective steps of a flowchart is not limited to the order illustrated in the flowchart, and the order may be changed within the range not deviating from the spirit and/or scope of the present technology. Incidentally, the present technology is not limited by the various embodiments described herein. In addition, in various elements in the following embodiments, various elements that a person skilled in the art is able to readily conceive of or various elements that are substantially the same and/or similar as the elements discussed herein are also included.

With reference to the drawings, FIG. 1 is a block diagram illustrating one example of a portable computing device 1 in accordance with one embodiment of the present technology. The portable computing device 1 according to the illustrated embodiment of the present technology is one of various portable computing devices such as, for example, a smartphone, a tablet, a cellular telephone, a game terminal, and a Personal Digital Assistant (PDA), etc., among other portable computing devices that are possible and contemplated herein In FIG. 1, the portable computing device 1 includes, among other components, a microphone 11 configured to detect a sound, an analysis unit 12 configured to analyze attenuation of the sound that is detected by the microphone 11 in a predetermined frequency band of the sound, a command input unit 13 configured to input a command based on the analysis by the analysis unit 12, a detection unit 14 configured to detect tapping performed on the portable computing device 1, and a processing unit 15 configured to execute processing according to the command that is input from the command input unit 13.

It is possible to configure the analysis unit 12, the command input unit 13, the detection unit 14, and the processing unit 15 by, for example, modules of hardware and/or software (e.g., programs such as an Operating System (OS), an Application Programming Interface (API), services, utilities, libraries, drivers, applications, and so forth). In addition, the portable computing device 1 may execute the program(s) to implement the various functions of the analysis unit 12, the command input unit 13, the detection unit 14, and the processing unit 15.

A microphone 11 may include a module configured to detect (e.g., pick up) and input the sound, and it is possible to configure the microphone 11 by, for example, a single microphone, a dual microphone, a microphone array, and so forth.

An analysis unit 12 can include a sound frequency analyzing function. The analysis unit 12 may analyze the attenuation of the sound that is input from the microphone 11 within the predetermined frequency band of the sound and determine, for example, a direction in which a user swipes the portable computing device 1 with his/her finger relative to the microphone 11. As will be described in detail elsewhere herein, for example, in a situation in which the portable computing device 1 is put in a pocket of an article of clothing, when the portable computing device 1 is swiped with the finger through the pocket (e.g., clothing material), a cloth rubbing sound is generated (see FIG. 4). It is possible to detect this cloth rubbing sound by extracting the predetermined frequency band of the input sound. It is further possible to determine the direction that the user swipes the portable computing device 1 with his/her finger relative to the microphone 11 by analyzing the attenuation of the cloth rubbing sound (in the predetermined frequency band of the input sound). Alternatively, or additionally, the analysis unit 12 may decide that the direction in which the user swipes the portable computing device 1 with his/her finger relative to the microphone 11 is a direction that the finger approaches the microphone 11 or a direction that the finger moves away from the microphone 11. In addition, or alternatively, the analysis unit 12 may determine not only the direction that the user swipes the portable computing device 1 with his/her finger relative to the microphone 11, but also a length along which the swiping is performed with the finger.

The detection unit 14 can include a function of detecting a tapping operation that the user performs on the portable computing device 1 with his/her finger. It is possible to configure the detection unit 14 with, for example, a G sensor, a capacitor, an accelerometer, and so forth. The detection unit 14 is able to detect the tapping operation (including tapping frequency and a tapping rhythm) that the user performs on the portable computing device 1 by, for example, three-dimensionally analyzing a fluctuation in sensor output from the G sensor or capacitor. For example, in a situation in which the portable computing device 1 is put in the pocket of an article of clothing, even when the user taps the portable computing device 1 with his/her finger through the pocket (the material), the detection unit 14 is able to detect the tapping operation from a vibration generated when tapping the portable computing device 1.

The command input unit 13 inputs the command based at least in part on the result of an analysis performed by the analysis unit 12. A command can include various commands including for, for example, volume turning-up, volume turning down, power-ON, power-OFF, screen locking, screen unlocking, and so forth, among other commands that are possible and contemplated herein.

In addition, the command input unit 13 may input different commands between a situation in which the direction that the user swipes the portable computing device 1 with his/her finger relative to the microphone 11 is a direction that the finger approaches the microphone 11 and a situation in which the direction that the user swipes the portable computing device 1 with his/her finger relative to the microphone 11 is a direction that the finger moves away from the microphone 11. For example, in a situation in which the direction that the user swipes the portable computing device 1 with his/her finger relative to the microphone 11 is the direction that the finger approaches the microphone 11, the command for turning up the volume may be input. On the other hand, in a situation in which the direction that the user swipes the portable computing device 1 with his/her finger relative to the microphone 11 is the direction that the finger moves away from the microphone 11, the command for turning down the volume may be input.

In addition, the command input unit 13 may input the command based on the detection unit 14 detecting a tapping on the portable computing device 1. For example, the command input unit 13 may input the command corresponding to the tapping frequency and the tapping rhythm obtained when the user taps the portable computing device 1. In addition, for example, in a situation in which the tapping operation of a predetermined rhythm is performed, the command input unit 13 may input the command for power-OFF.

Further, the command input unit 13 may input a command corresponding to a combination of the result of analysis by the analysis unit 12 with the result of detection by the detection unit 14. For example, in a situation in which swiping and tapping are performed twice in the direction that the finger moves away from the microphone 11, the command input unit 13 may input the command for power-OFF. In addition, one input command may be selected by swiping the portable computing device 1 with the finger, the command so selected may be differentiated by the tapping operation, and then the command so differentiated may be input. For example, in a situation in which swiping is performed with the finger in the direction that the finger approaches the microphone 11, the command for turning up the volume may be selected, and thereafter in a situation in which tapping is performed twice, the selected command may be settled and input.

In addition, in a situation in which the command is input, the command input unit 13 may notify the user that the command is input (e.g., the command is successfully input) with a vibration of a vibrator and so forth using, for example, haptic feedback.

As describe above, the portable computing device 1 according to the present embodiment includes the microphone 11 configured to input the sound, the analysis unit 12 configured to analyze the attenuation of the sound that is input from the microphone 11 in the predetermined frequency band of the sound, and the command input unit 13 configured to input the command based on an analysis by the analysis unit 12. Accordingly, it becomes possible to input a command that is sent from outside of the pocket in a state of putting the portable computing device 1 in the pocket and so forth of an article of clothing without disturbing the surrounding people, unlike voice input and/or without taking the portable computing device 1 out of the pocket and so forth.

In addition, the analysis unit 12 can analyze the attenuation of the input sound in the predetermined frequency band of the sound and thereby determine the direction that the user swipes the portable computing device 1 with his/her finger relative to the microphone 11, and the command input unit 13 inputs the command corresponding to the direction that the user swipes the portable computing device 1 with his/her finger relative to the microphone 11. Accordingly, it becomes possible to input the command simply by swiping the portable computing device 1 with the finger through the material(s) of the pocket of an article of clothing. Additionally, or alternatively, it is possible to decide the direction that swiping is performed with the finger by using a single microphone, and therefore it becomes possible to achieve a low-cost configuration. In addition, it is possible to allocate a different command depending on each direction that swiping is performed with the finger, and therefore it becomes possible to input a plurality of commands using a finger.

Further, since the command input unit 13 is configured to input the command for turning up the volume in the situation in which the direction that the user swipes the portable computing device 1 with his/her finger relative to the microphone 11 is the direction that the finger approaches the microphone 11 and to input the command for turning down the volume in the situation in which the direction that the user swipes the portable computing device 1 with his/her finger relative to the microphone 11 is the direction that the finger moves away from the microphone 11, it becomes possible to turn up/down the volume with relative ease.

In addition, since the portable computing device 1 further includes the detection unit 14 configured to detect the tapping operation performed on the portable computing device 1 and the command input unit 13 is configured to input the command based on the detection of the tapping operation by the detection unit 14, it becomes possible for the user to input the command by performing a tapping operation.

Further, since the command input unit 13 is configured to input the command corresponding to the combination of the result of analysis by the analysis unit 12 with the result of detection by the detection unit 14, it becomes possible to input many different types of commands by combining a swiping operation with a tapping operation.

Figure 2:
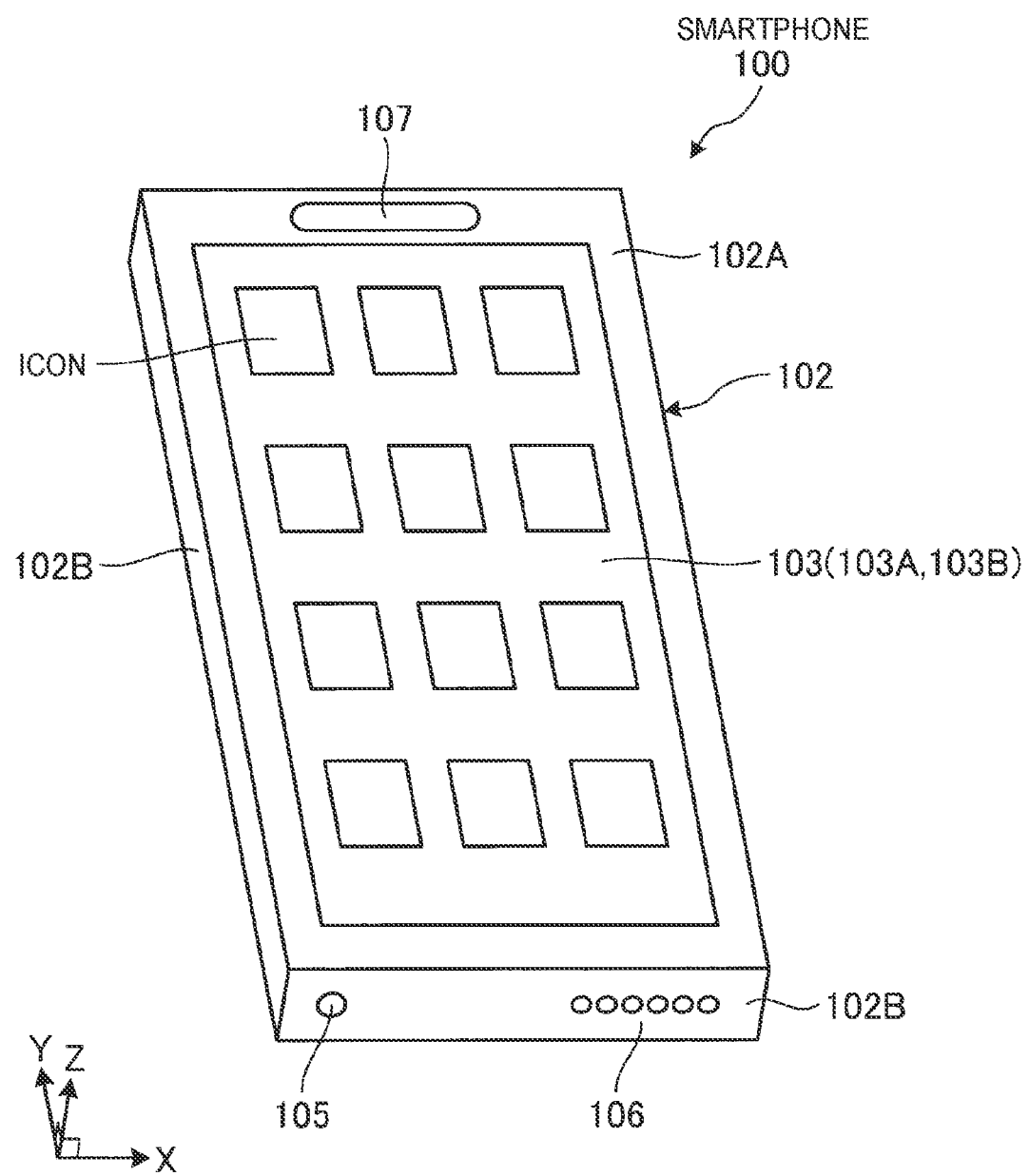
FIG. 2 is a perspective view illustrating one example of an appearance of a smartphone to which the portable computing device according to one embodiment of the present technology is applied.

The following description is made by exemplifying a situation in which the portable computing device 1 according to the present embodiment is applied to a smartphone 100. FIG. 2 is a perspective view illustrating one example of an external appearance of a smartphone 100 in which the portable computing device 1 according to the present embodiment is applied.

As illustrated in FIG. 2, the smartphone 100 includes a chassis 102 that may include any suitable shape including, for example, an almost hexahedral shape, among other shapes that are possible and contemplated herein. In surfaces of the chassis 102, the surface on one side will be referred to as a front face 102A, the other side surface that faces the front face 102A will be referred to herein as a back face (not illustrated), and the surface that is between the front face 102A and the back face in the surfaces of the chassis 102 will be referred as a side face 102B. The smartphone 100 includes a touch display unit 103 with a display section 103B configured to display information, such as letters/characters, figures, icons, images and so forth, and a touch sensor 103A that is disposed on the display section 103B. The display section 103B may be disposed on any suitable location including, for example, an almost central part of the front face 102A of the chassis 102, among other locations that are possible and contemplated herein.

A receiver 107 may be disposed on an upper part of the front face 102A of the chassis 102. A volume button (not illustrated) configured to adjust the volume, a power button (not illustrated), and so forth may be disposed on the right-side face 102B of the chassis 102, among other locations that are possible and contemplated herein. In addition, a microphone 105 and a speaker 106 may be disposed on the lower-side face 102B of the chassis 102, among other locations that are possible and contemplated herein.

The touch display unit 103 can display any suitable information, such as the characters/letters, the figures, the icons, the images and so forth and detects various operations that are performed on the touch sensor 103A, by using the finger, a stylus, a pen and so forth (in the following, referred to as indicators), among other information that is possible and contemplated herein. Systems, such as a capacitance system, a pressure-sensitive system, and/or so forth, may be utilized as a system by which the touch sensor 103A detects the various operations described herein. In addition, the icons corresponding to various applications and so forth may be displayed on the touch display unit 103. The user can touch one particular icon, and thereby, the user is able to initiate an application corresponding to the touched icon.

Figure 3:
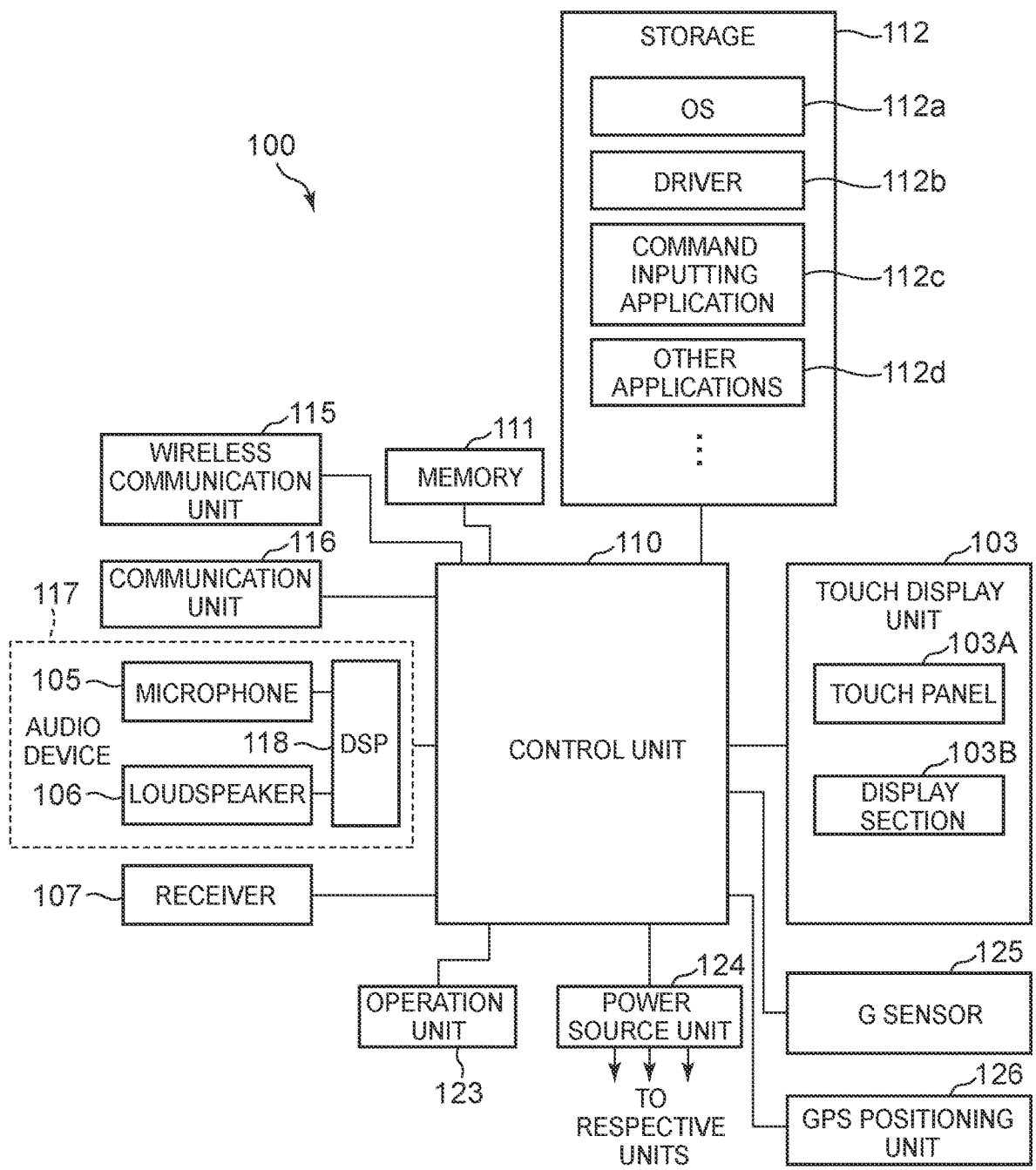
FIG. 3 is a block diagram illustrating one example of hardware of the smartphone in FIG. 2.

FIG. 3 is a block diagram illustrating one configuration example of hardware of the smartphone 100 described with reference to FIG. 2. As illustrated in FIG. 3, the smartphone 100 can include, among other components, a control unit 110, a memory 111, a storage unit 112, a wireless communication unit 115, a communication unit 116, an audio device 117, a power source 124, the touch display unit 103 (the touch sensor 103A and the display section 103B), an operation unit 123, the receiver 107, a G sensor 125, a Global Positioning System (GPS) unit 126, and so forth.

The touch display unit 103 can include the display section 103B and the touch sensor 103A that is superposed on the display section 103B. The touch sensor 103A detects each of the various operations that can be performed on the touch sensor 103A by using the indicators such as the finger, the stylus, the pen, and so forth together with the position of a location where the particular operation is performed on the touch sensor 103A, and notifies the control unit 110 of the detected operation and/or position. A touching operation (e.g., a sliding operation and/or a pitching operation, among other touch operations that are possible and contemplated herein) may be included in the operations detected by the touch sensor 103A. The display section 103B may be configured by, for example, a liquid crystal display (LCD), an Organic Electro-Luminescence (organic EL) panel, and so forth and displays the information, such as the characters/letters, the figures, the icons, the images, and so forth.

The operation unit 123 can accept the operation of the user via the power button, the volume button, and so forth and transmit an instruction signal corresponding to the accepted operation to the control unit 110.

The power source 124 can supply the electric power obtained from a storage battery or an AC adopter to the respective units of the smartphone 100 including, for example, the control unit 110 in accordance with control of the control unit 110.

The communication unit 116 can establish a wireless signal line between the smartphone 100 and a base station via a channel that is allocated from the base station and perform telephone communication and/or information communication between the smartphone 100 and the base station by, for example, a 3G/4GLTE (3rd-Generation/4th-Generation Long Term Evolution) system.

The wireless communication unit 115 can perform communication operations that are based on the Bluetooth® communication standard and communication that is based on the communication standard named Wireless Fidelity (Wi-Fi).

The sensor 125 (e.g., a G sensor) can detect accelerations x, y, and z in an X-axis direction, a Y-axis direction, and a Z-axis direction (see FIG. 2) of the smartphone 100 and output the detected accelerations x, y, and z to the control unit 110 as sensor output. In addition, the G sensor 125 can be configured such that the electric power that is supplied from the power source unit 124 to the G sensor, even in a situation in which the smartphone 100 is in a screen-locked state (an energy saving state), so as to be operable even in the screen-locked state (the energy saving state).

The GPS unit 126 can receive radio waves from a plurality of GPS satellites, acquire geographical position data that is based on latitude/longitude information, and output the acquired geographical position data to the control unit 110.

The audio device 117 includes the microphone 105, the speaker 106, and a voice processing Digital Signal Processor (DSP) 118. The microphone 105 can detect (e.g., pick up) sounds including, for example, a voice and output the detected sound(s) to the DSP 118. The speaker 106 can output the voice according to voice data that is output from the DSP 118.

The DSP 118 has a "wake on voice" function and the electric power is supplied from the power source 124 to the DSP 118, even in the screen locked state (the energy saving state). Therefore, it becomes possible for the audio device 117 to pick up the sounds from the microphone 105 even in the screen locked state (the energy saving state). In addition, the DSP 118 may be also configured so as to wake up immediately after detection of the tapping operation by the G sensor 125 and to perform voice input.

The DSP 118 may be equipped with a voice processing LSI that includes an A/D converter, a D/A converter, an amplifier, various filters, a memory, and so forth and perform A/D conversion and signal processing on the sound (including the voice) that is input from the microphone 105 and output sound data (digital data) so subjected to the signal processing to the control unit 110, and perform signal processing on sound data (digital data) that is input from the control unit 110, perform D/A conversion on the sound data so subjected to signal processing, and output the sound data so subjected to D/A conversion from the speaker 106.

The memory 111 may be configured by, for example, a Random Access Memory (RAM), a Dynamic Random Access Memory (DRAM), and so forth, among other types of memory that are possible and contemplated herein, and can be used as a work area into which programs executed by the control unit 110, data that the control unit 110 refers to, a result of arithmetic operations of the control unit 110 and so forth, are at least temporarily stored.

The storage 112 may be configured by, for example, a nonvolatile memory (e.g., an Electrically Erasable Programmable Read-Only Memory (EEPROM), an Solid State Drive (SSD), and the like, among other types of memory that are possible and contemplated herein) and save the programs and the data used for processing in the control unit 110. The programs stored in the storage 112 can include an Operating System (OS) 112a for implementing each function of the smartphone 100, a driver 112b for controlling hardware of the device, a command input application 112c used for performing command input in a state of putting the smartphone 100 in the pocket of an article of clothing, other applications 112d, such as a voice reproduction application used for reproducing a voice file, a telephone application used for implementing a telephone function, a mail application used for implementing an E-mail function, a browser application used for implementing a WEB browsing function, a file browsing application, a word processor application and so forth, various pieces of data, and so forth, among other programs that are possible and contemplated herein. Communication between each of the various applications and the device can be performed via the OS 112a.

The control unit 110 may be configured by, for example, a Central Processing Unit (CPU), a microprocessor, a DSP and so forth, and implement various functions and/or modes by all-inclusively controlling the operation of the smartphone 100. Specifically, the control unit 110 can execute the command(s) contained in the program that is stored in the storage 112 while referring to data that is stored in the storage 112 and data that is decompressed in the memory 111, as necessary, control the touch display unit 103, the wireless communication unit 115, the communication unit 116, the audio device 117, and so forth, and thereby implement the various functions and/or modes. Further, the program that the control unit 110 executes and the data that the control unit 110 refers to may be downloaded from a server and/or other device and uploaded onto the sever and/or other device via communication using the communication unit 116 and/or the wireless communication unit 115.

The command input application 112c includes an application used when the user performs command inputting by swiping the smartphone 100 with his/her finger through the material (e.g., over the pocket) in the state of putting the smartphone 100 in the pocket and so forth.

The command input application 112c can analyze the attenuation of the predetermined frequency band of the sound that is input from the microphone 105 and executes command input processing for outputting the command corresponding to the result of analysis to the OS 112a. In addition, in the command input processing, the command input application 112c detects the tapping operation (e.g., the tapping frequency and/or the tapping rhythm) by three-dimensionally analyzing the fluctuation in sensor output that is input from the G sensor 125 and output the command corresponding to the detected tapping operation (e.g., the tapping frequency and/or the tapping rhythm) to the OS 112a. The OS 112a can execute the command that is input from the command input application 112c.

In the above-described configuration, for example, the audio device 117, the control unit 110, the command input application 112c, and so forth are able to implement the function of the analysis unit 12 in FIG. 1. In addition, the control unit 110, the command input application 112c, and so forth are able to implement the function of the command input unit 13 in FIG. 1. Further, the G sensor 125, the command input application 112c, and so forth are able to implement the function of the detection unit 14 in FIG. 1. In addition, the control unit 110, the OS 112a, and so forth are able to implement the function of the processing unit 15 in FIG. 1.

The command input processing executed by the command input application 112c is described with reference to FIG. 4 through FIG. 9. First, a principle on the basis with which the command input application 112c analyzes the attenuation of the sound that is input from the microphone 105 in the predetermined frequency band of the sound and thereby determines the direction that swiping is performed with the finger is described with reference to FIG. 4 through FIG. 8.

Figure 4:
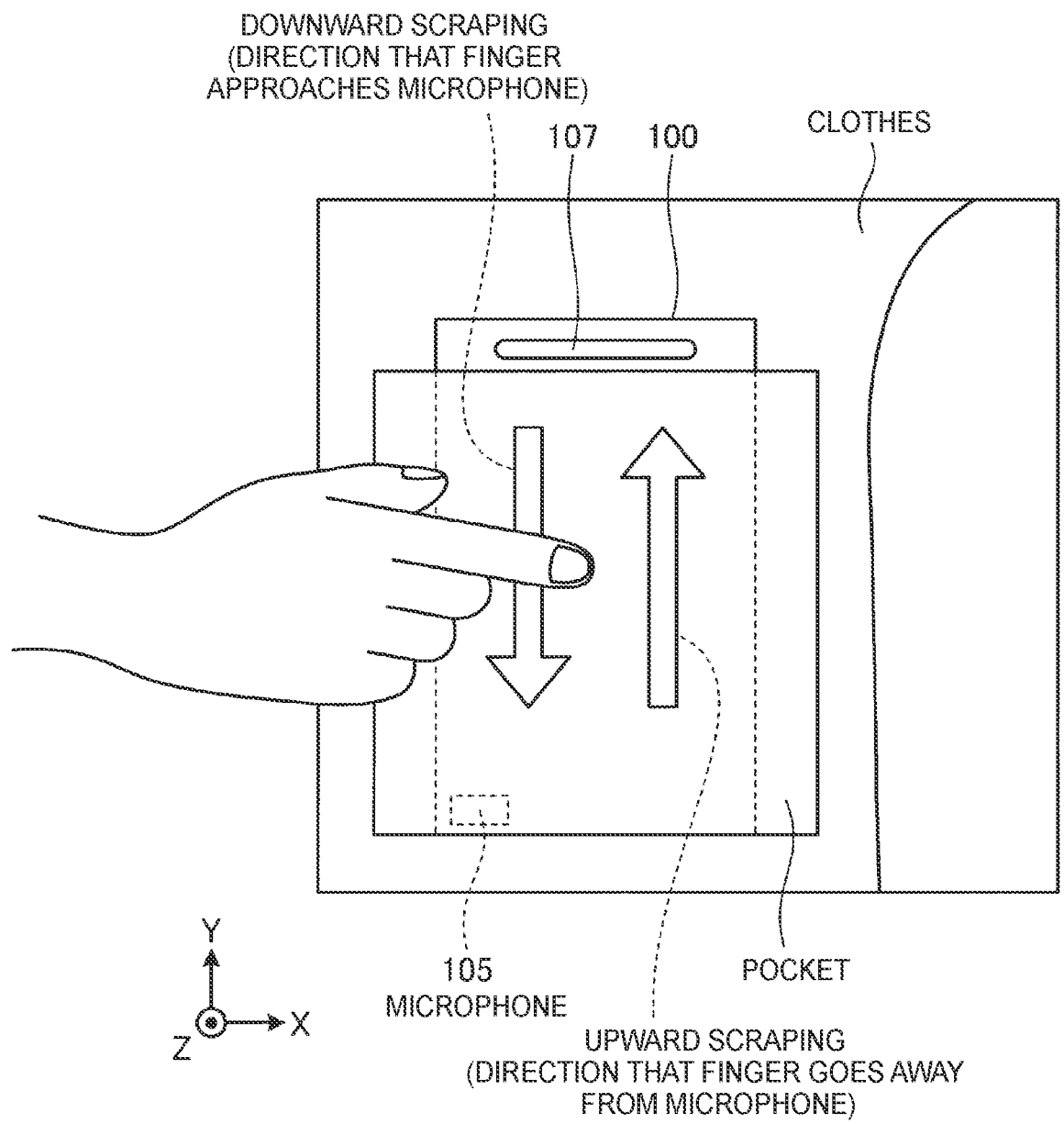
FIG. 4 is an explanatory diagram illustrating one example of a use state of the smartphone in FIG. 2.

FIG. 4 is an explanatory diagram illustrating one example of a use state of the smartphone 100. As illustrated in FIG. 4, there are situation in which a user desire to use the smartphone 100 in a state of putting the smartphone 100 in the pocket of his/her clothing. The present embodiment makes it possible for the user to input the command in the state of putting the smartphone 100 in the pocket of his/her clothing. In the present embodiment, for example, when the user swipes the smartphone 100 with his/her finger that is put in the pocket of his/her clothing through the fibers (cloth) of the pocket, a cloth rubbing sound (e.g., a sound of friction between the finger and the fibers: also called a swiping sound) is generated. The attenuation of the cloth rubbing sound in the predetermined frequency band of the sound is analyzed, the direction that swiping is performed with the finger is determined, and the command corresponding to the determined direction that the swiping is performed with the finger is input.

For example, in FIG. 4, which is a situation in which the smartphone 100 is put into the pocket with the microphone 105 facing downward, it becomes possible for the user to input the command by swiping the smartphone 100 with his/her finger downward (e.g., the direction that his/her finger approaches the microphone 105) and upward (e.g., the direction that his/her finger moves away from the microphone 105) through the material of the pocket. For example, in a situation in which the user swipes the smartphone 100 with his/her finger in the direction that his/her finger approaches the microphone 105 (e.g., downward) through the material of the pocket, the command for turning up the volume may be input. On the other hand, in a situation in which the user swipes the smartphone 100 with his/her finger in the direction that his/her finger moves away from the microphone 105 (e.g., upward) through the material of the pocket, the command for turning down the volume may be input.

Additionally, or alternatively, a situation in which the smartphone 100 is put into the pocket with the microphone 105 facing downward is illustrated in FIG. 4. However, in a situation in which the smartphone 100 is put into the pocket with the microphone 105 facing upward, the direction that swiping is performed is reversed. In a situation in which the user swipes the smartphone 100 upward (e.g., the direction that his/her finger approaches the microphone 105) with his/her finger through the material of the pocket, the command for turning up the volume may be input. On the other hand, in a situation in which the user swipes the smartphone 100 downward (e.g., the direction that his/her finger moves away from the microphone 105) with his/her finger through the material of the pocket, the command for turning down the volume may be input.

Figure 5B:
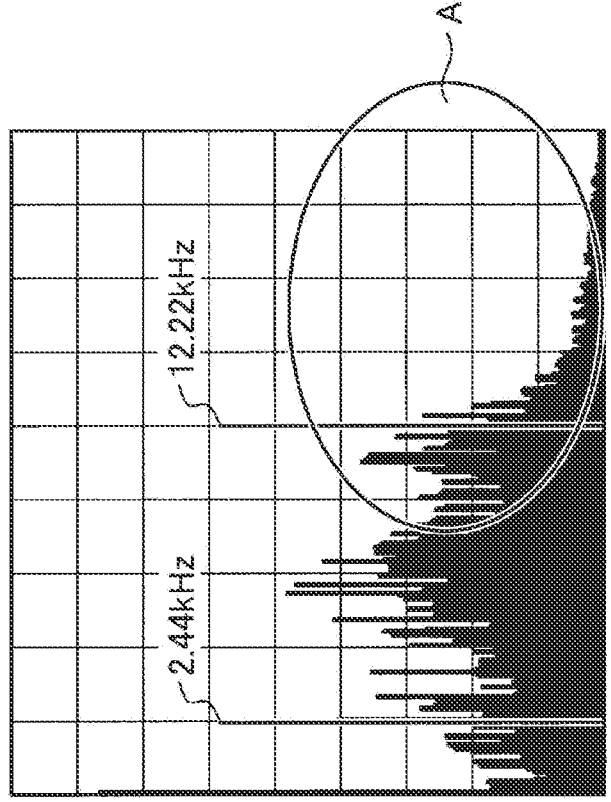
FIGS. 5A and 5B are diagrams comparatively illustrating examples of a frequency spectrum of a cloth rubbing sound and a frequency spectrum of a voice and a normal sound.
Figure 5A:
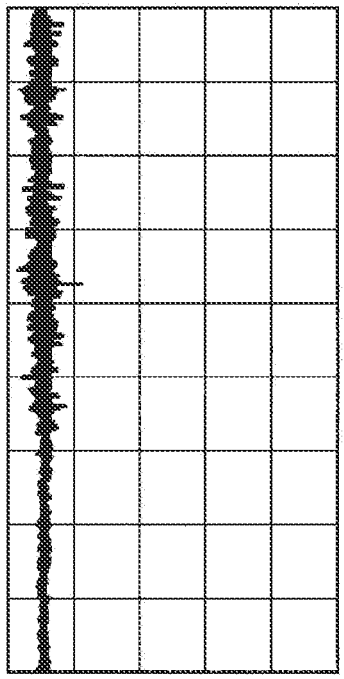
Figure 5A:
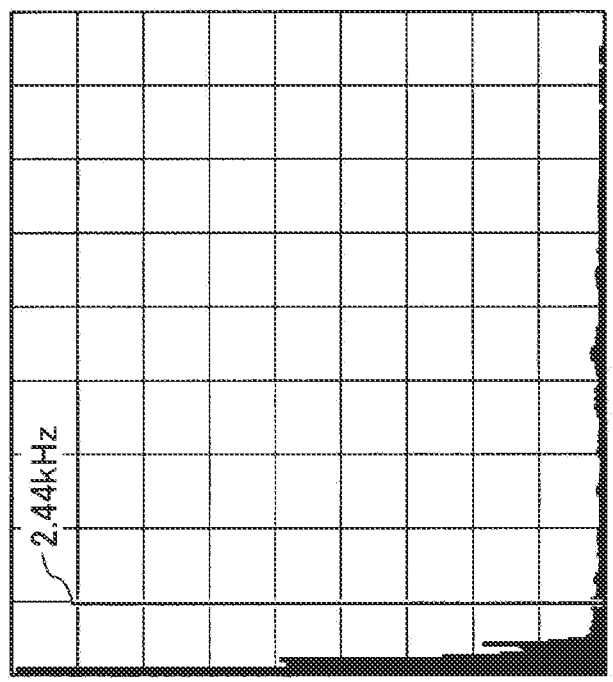

FIGS. 5A and 5B are diagrams illustrating examples of a frequency spectrum of the cloth rubbing sound and a frequency spectrum of a voice and a normal sound. Specifically, FIG. 5A illustrates one example of the frequency spectrum of the voice and the normal sound and FIG. 5B illustrates one example of the frequency spectrum of the cloth rubbing sound.

The frequency of a main component of the voice and the normal sound is less than or equal to about 2.44 kHz (=22 kHz×1/9) and a frequency component that exceeds 2.44 kHz is not observed, also including a harmonic component as illustrated in FIG. 5A. On the other hand, the cloth rubbing sound includes frequency components that are widely distributed up to about 12.22 kHz (=22 kHz×5/9) as illustrated in FIG. 5B. The limit of input characteristics of the microphone of a general smartphone and so forth is not more than about 20 kHz, and therefore sufficient discrimination between the cloth rubbing sound and the voice or the normal sound is possible (e.g., a situation of sampling processing of about 44.1 kHz).

From the above, it is possible to detect the cloth rubbing sound by extracting a frequency band, for example, from about 2.4 kHz to about 12.22 kHz of the input sound, and it is more desirable to extract a band of higher frequencies in the above-described frequency band to avoid erroneous detection of the voice and the normal sound.

In addition, when observing frequencies which are higher than about 8 kHz (e.g., region A) in Figure B, the sound is rapidly attenuated depending on the distance. When the finger approaches the microphone 105 through the material of a pocket (e.g., downward swiping in FIG. 4), the total amount of the frequency spectrum in this region is increased. On the other hand, when the finger moves away from the microphone 105 through the material of the pocket (e.g., upward swiping in FIG. 4), the total amount of the frequency spectrum in this region is rapidly decreased.

Figure 6A:
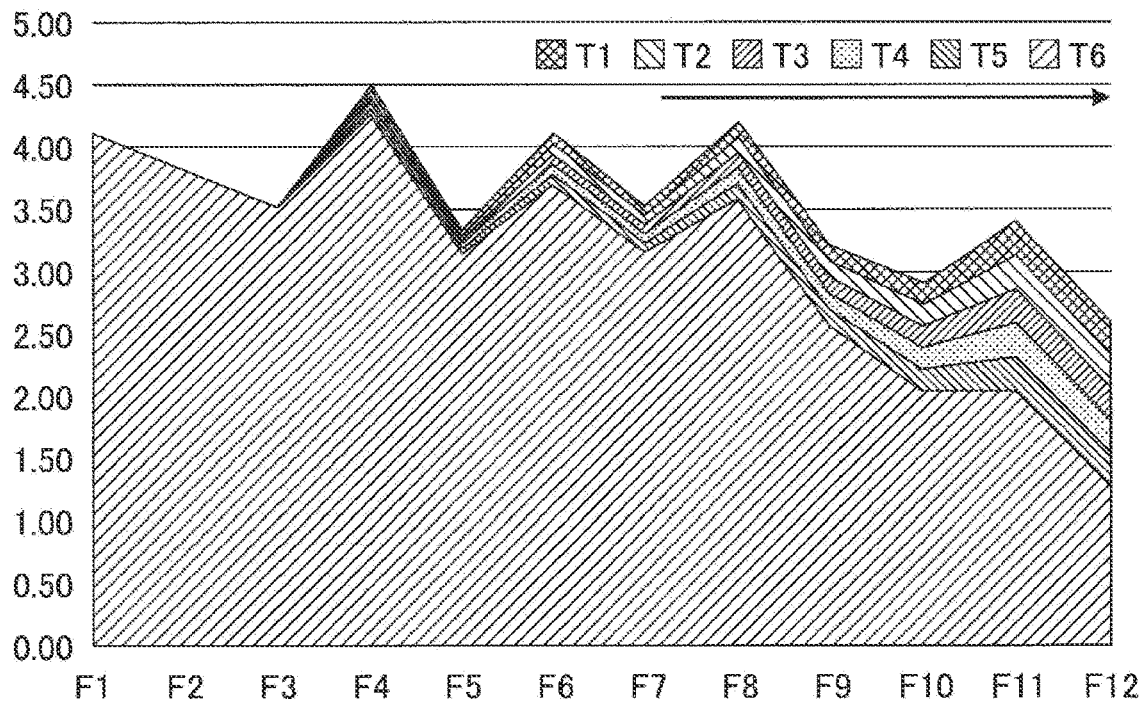
FIGS. 6A and 6B are diagrams illustrating examples of a time-series transition of a power spectrum.
Figure 6B:
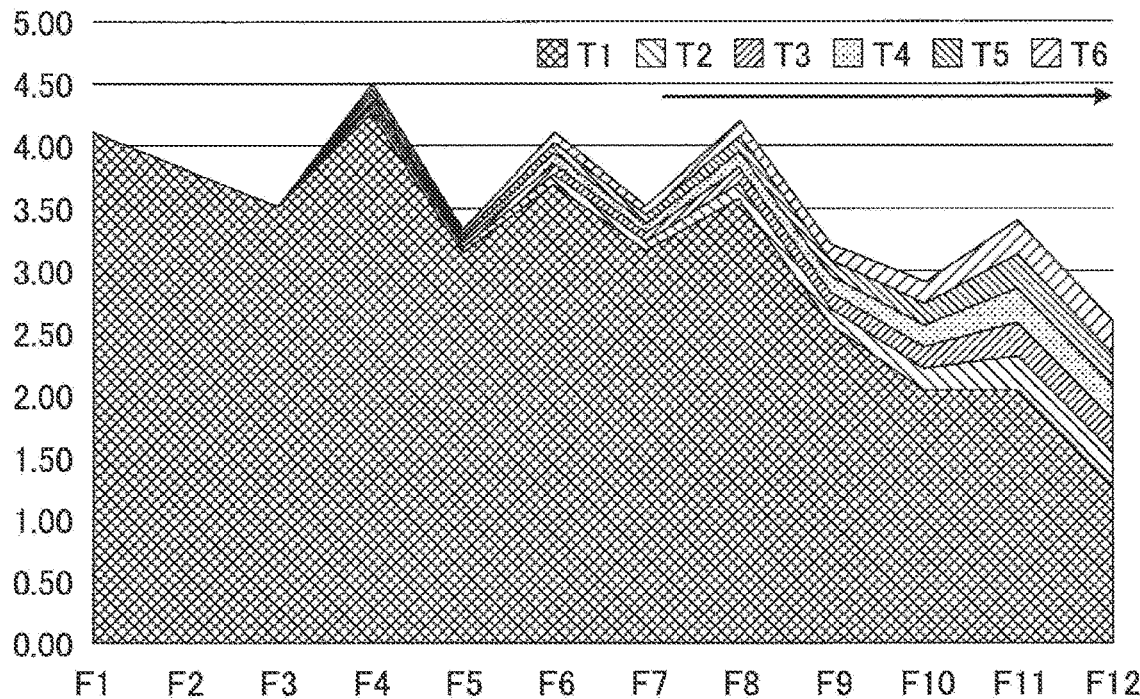

FIGS. 6A and 6B are diagrams illustrating examples of time-series transitions of power spectrums. Specifically, FIG. 6A illustrates one example of each transition of each power spectrum at each time (e.g., T1 to T6) in a situation of swiping the smartphone 100 with the finger through the pocket material so as to go away from the microphone 105. FIG. 6B illustrates one example of each transition of each power spectrum at each time (e.g., T1 to T6) in a situation of swiping the smartphone 100 with the finger through the material so as to approach the microphone 105. In FIGS. 6A and 6B, the horizontal axis indicates a frequency F (e.g., F1<F12), and the vertical axis indicates power.

When swiping is performed with the finger through the material so as to go away from the microphone 105, the total amount of the frequency spectrum is decreased, as illustrated in FIG. 6A. On the other hand, when swiping is performed with the finger through the clothes so as to approach the microphone 105, the total amount of the frequency spectrum is increased as illustrated in FIG. 6B.

Figure 7:
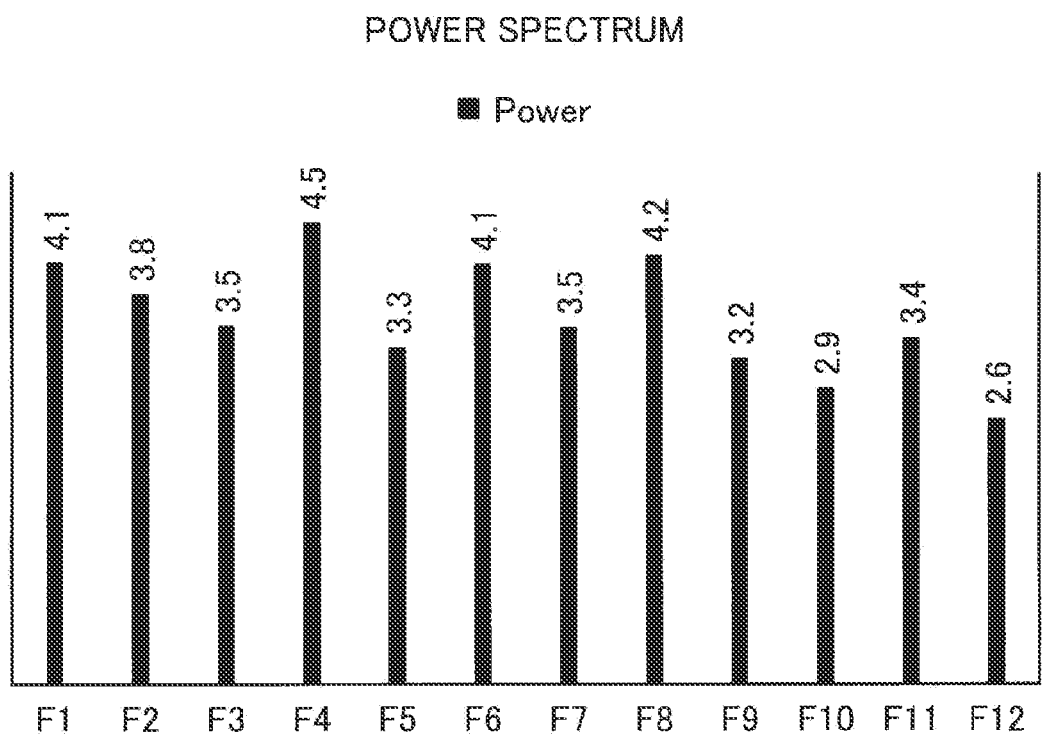
FIG. 7 is a diagram illustrating one example of powers of respective frequencies of the power spectrum of the cloth rubbing sound.

FIG. 7 is a diagram illustrating one example of the power of the respective frequencies (e.g., F1 to F12) of the power spectrum of the cloth rubbing sound. The horizontal axis indicates the frequency (e.g., F1 to F12), and the vertical axis indicates the power. It is possible to calculate an amount P of an average power spectrum by $\Sigma Pn$ (n=1, ..., N)/N. It is possible to calculate the frequency of the average power spectrum by $\Sigma Pn*Fn$ (n=1, ..., N)/$\Sigma NPn$ (n=1, ..., N).

Figure 8:
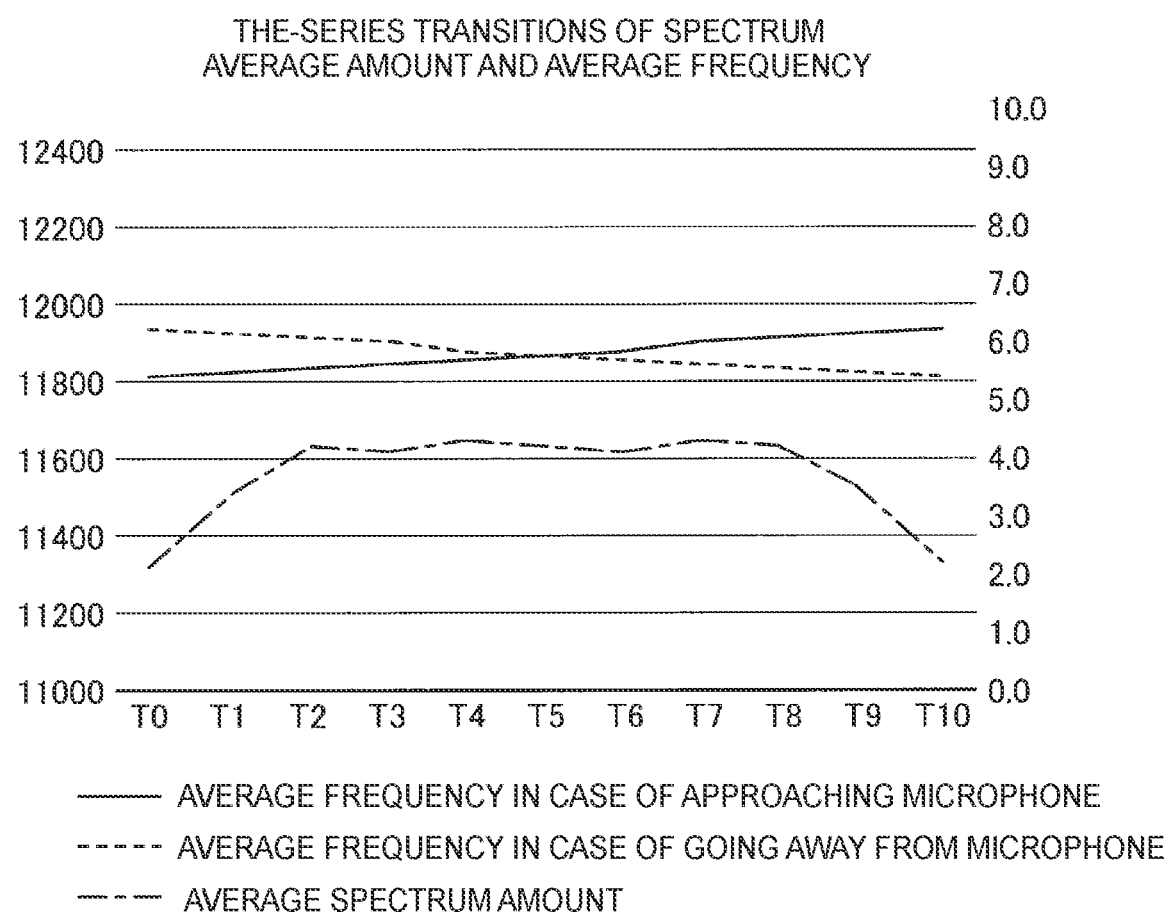
FIG. 8 is a diagram illustrating one example of characteristics of time-series transitions of an average spectrum and an average frequency of the cloth rubbing sound.

FIG. 8 is a diagram illustrating one example of characteristics of the time-series transitions of the average power spectrum and the average frequency of the cloth rubbing sound. The horizontal axis indicates the time (e.g., T0 to T10), and the vertical axis indicates the average frequency (e.g., within a range from about 11000 Hz to about 12400 Hz) and the power. In FIG. 8, a solid line indicates the average frequency in a case where the finger approaches the microphone 105, a dashed line indicates the average frequency in a case where the finger moves away from the microphone 105, and a dashed-dotted line indicates the average power spectrum amount. The average frequency in the situation in which the finger approaches the microphone 105 is increased as illustrated in FIG. 8. On the other hand, the average frequency in the case where the finger moves away from the microphone 105 is decreased.

The command input application 112c samples the predetermined frequency band of the sound that is input from the microphone 105 at predetermined time intervals, and in a situation in which the spectrum amount of the sampled average frequency is increased in time-series, determines that the direction that swiping is performed is the direction that the finger approaches the microphone 105, and in a situation in which the spectrum amount of the sampled average frequency is decreased in time-series, determines that the direction that swiping is performed is the direction that the finger moves away from the microphone 105.

Figure 9:
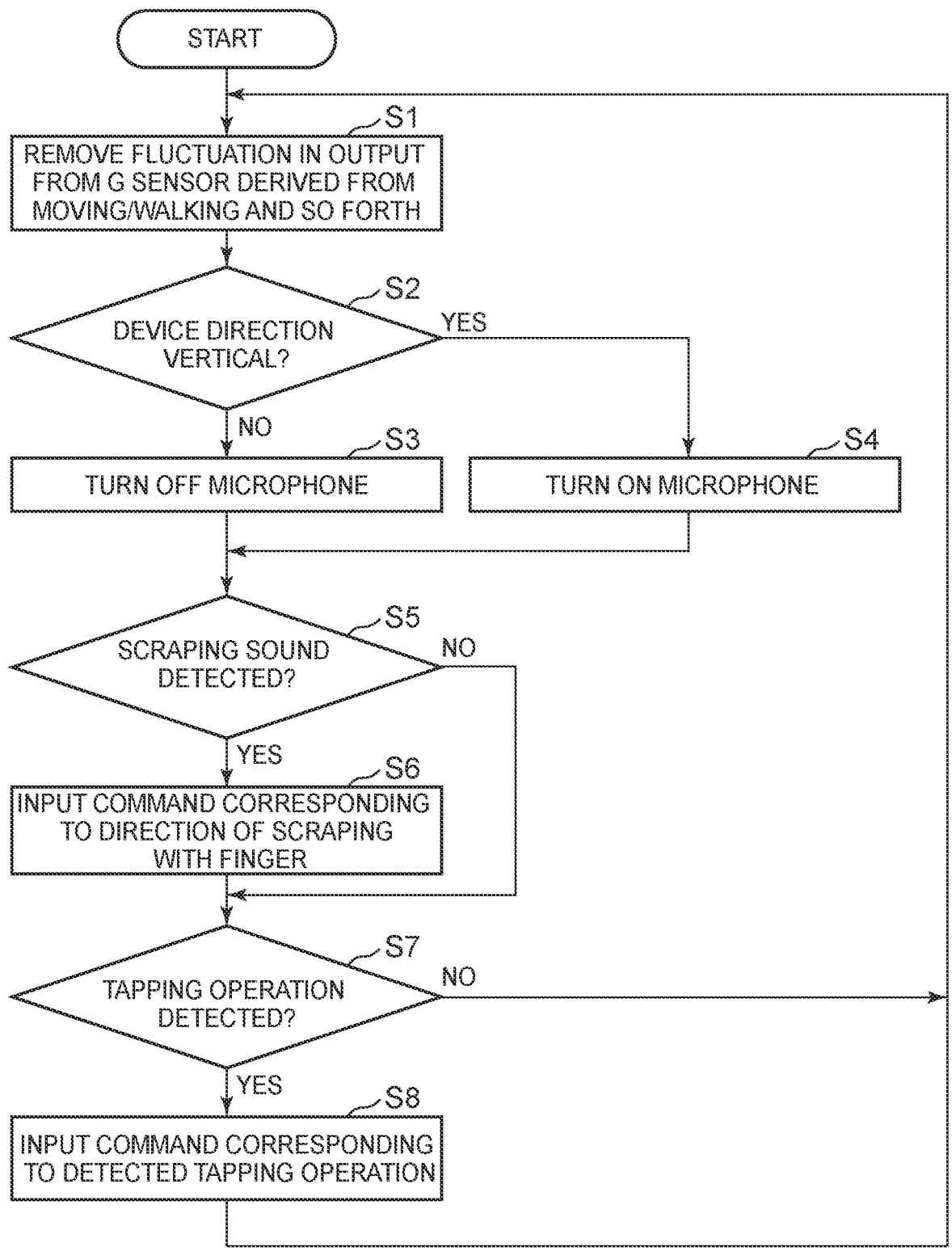
FIG. 9 is a flowchart describing command input processing that is executed in accordance with a command input application.

FIG. 9 is a flowchart illustrating one example of the command input processing that is executed by the command input application 112c. In FIG. 9, the command input application 112c initially removes a fluctuation in output from the G sensor 125 derived from moving/walking of the user who possesses the smartphone 100 (block S1). Then, the command input application 112c determines whether the direction (e.g., the orientation) of the smartphone 100 is an almost vertical direction based on the of sensor output from the G sensor 125 (block S2). This decision is made to decide whether the smartphone 100 is in a state of being put in the pocket of an article of clothing. In a situation in which the direction of the smartphone 100 is the almost vertical direction (e.g., the Y-axis direction of the smartphone 100 is almost parallel with a gravity direction), it is determined that the smartphone 100 is in the state of being put in the pocket of clothing.

In a situation in which the direction of the smartphone 100 is the almost vertical direction (e.g., a "YES" in block S2), the command input application 112c turns ON the microphone 105 (block S4). On the other hand, in a situation in which the direction (e.g., the orientation) of the smartphone 100 is not the vertical direction (e.g., a "NO" in block S2), the command input application 112c turns OFF the microphone 105 (block S3). This determination is made to reduce power consumption by turning ON the microphone 105 when the smartphone 100 is put in a pocket of an article of clothing.

Next, the command input application 112c determines whether the cloth rubbing sound (e.g., the swiping sound) is detected from the sound that is input from the microphone 105 (block S5). In a situation in which the cloth rubbing sound is not detected (e.g., a "NO" in block S5), the command input application 112c shifts to block S7.

On the other hand, in a situation in which the cloth rubbing sound is detected (e.g., a "YES" in block S5), the command input application 112c determines that the direction that swiping is performed with the finger based on the cloth rubbing sound and inputs the command according to the determined direction that swiping is performed with the finger (block S6). More specifically, in a situation in which the direction that swiping is performed with the finger is the direction that the finger approaches the microphone 105, the command input application 112c outputs the command for turning up the volume to the OS 112a, and the OS 112a turns up the volume in accordance with the input command. On the other hand, in a situation in which the direction that swiping is performed with the finger is the direction that the finger moves away from the microphone 105, the command input application 112c outputs the command for turning down the volume to the OS 112a, and the OS 112a turns down the volume.

In block S7, the command input application 112c determines whether the tapping operation of the finger is detected on the basis of the sensor output from the G sensor 125 (block S7). In a situation in which the tapping operation of the finger is not detected (e.g., a "NO" in block S7), the command input application 112c returns to block S1.

On the other hand, in a situation in which the tapping operation of the finger is detected (e.g., a "YES" in block S7), the command input application 112c inputs the command corresponding to the detected tapping operation (e.g., the tapping frequency, the tapping rhythm, and/or so forth) (block S8). More specifically, the command input application 112c outputs the command corresponding to the detected tapping operation (e.g., the tapping frequency, the tapping rhythm, and/or so forth) to the OS 112a and the OS 112a turns up the volume in accordance with the input command.

What is claimed is:

1. An apparatus, comprising:
a microphone configured to detect a friction sound generated by an input indicator through a textile, wherein:
the microphone is separate from a user,
the textile is situated between the input indicator and the microphone and proximate to the microphone, and
the textile is independent and physically separate from the microphone;
an analysis unit configured to analyze attenuation of the detected friction sound within a predetermined frequency band based on frequencies generated by rubbing cloth; and
a command input unit configured to input a volume command based on analysis of the detected friction sound by the analysis unit,
wherein at least a portion of each of said units comprise one or more of a set of hardware circuits, a set of programmable hardware devices, and executable code stored on a set of non-transitory computer-readable storage media.

2. The apparatus of claim 1, wherein:
the analysis unit determines a direction that a user swipes the textile with the input indicator relative to the microphone; and
the command input unit inputs the volume command corresponding to the direction that swiping is performed with the input indicator relative to the microphone.

3. The apparatus of claim 2, wherein:
the volume command is based on one of:
a first direction in which the user swipes the textile with the input indicator in an approaching direction relative to the microphone to decrease volume, and
a second direction in which the user swipes the textile with the input indicator in a moving away direction relative to the microphone to decrease volume.

4. The apparatus of claim 3, further comprising:
a detection unit configured to detect a tapping operation performed on the apparatus,
wherein the command input unit further inputs the volume command based on detecting the tapping operation by the detection unit.

5. The apparatus of claim 4, wherein:
the command input unit inputs the volume command that corresponds to a combination of the analysis by the analysis unit and the detection by the detection unit.

6. The apparatus of claim 2, further comprising:
a detection unit configured to detect a tapping operation performed on the apparatus,
wherein the command input unit further inputs the volume command based on detecting the tapping operation by the detection unit.

7. The apparatus of claim 6, wherein:
the command input unit inputs the volume command that corresponds to a combination of the analysis by the analysis unit and the detection by the detection unit.

8. The apparatus of claim 1, wherein:
the volume command is based on one of:
a first direction in which the user swipes the textile with the input indicator in an approaching direction relative to the microphone to decrease volume, and
a second direction in which the user swipes the textile with the input indicator in a moving away direction relative to the microphone to decrease volume.

9. The apparatus of claim 8, further comprising:
a detection unit configured to detect a tapping operation performed on the apparatus,
wherein the command input unit further inputs the volume command based on detecting the tapping operation by the detection unit.

10. The apparatus of claim 9, wherein:
the command input unit inputs the volume command that corresponds to a combination of the analysis by the analysis unit and the detection by the detection unit.

11. The apparatus of claim 1, further comprising:
a detection unit configured to detect a tapping operation performed on the apparatus,
wherein the command input unit further inputs the volume command based on detecting the tapping operation by the detection unit.

12. The apparatus of claim 11, wherein:
the command input unit inputs the volume command that corresponds to a combination of the analysis by the analysis unit and the detection by the detection unit.

13. A method, comprising:
detecting, by a microphone, a friction sound generated by an input indicator through a textile, wherein:
the microphone is separate from a user,
the textile is situated between the input indicator and the microphone and proximate to the microphone, and
the textile is independent and physically separate from the microphone;
analyzing, by a processor, attenuation of the detected friction sound within a predetermined frequency band based on frequencies generated by rubbing cloth; and
inputting a volume command to a portable computing device based on analysis of the detected friction sound.

14. The method of claim 13, further comprising:
determining a direction that a user swipes the textile with the input indicator relative to the microphone; and
inputting the volume command corresponding to the direction that swiping is performed with the input indicator relative to the microphone.

15. The method of claim 14, wherein:
the volume command is based on one of:
 a first direction in which the user swipes the textile with the input indicator in an approaching direction relative to the microphone to decrease volume, and
 a second direction in which the user swipes the textile with the input indicator in a moving away direction relative to the microphone to decrease volume.

16. The method of claim 15, further comprising:
detecting a tapping operation performed on the portable computing device,
wherein the volume command is further based on detecting the tapping command.

17. The method of claim 16, wherein:
the volume command corresponds to a combination of the analysis by the processor and detecting the tapping command.

18. A computer program product comprising a computer-readable storage medium including program instructions embodied therewith, the program instructions executable by a processor to cause the processor to:
detect a friction sound generated by an input indicator through a textile, wherein:
 the microphone is separate from a user,
 the textile is situated between the input indicator and the microphone and proximate to the microphone, and
 the textile is independent and physically separate from the microphone;
analyze attenuation of the detected friction sound within a predetermined frequency band based on frequencies generated by rubbing cloth; and
input a volume command to a portable computing device based on analysis of the detected friction sound.

19. The computer program product of claim 18, wherein the program instructions further cause the processor to:
determine a direction that a user swipes the textile with the input indicator relative to the microphone; and
input the volume command corresponding to the direction that swiping is performed with the input indicator relative to the microphone,
wherein the volume command is based on one of:
 a first direction in which the user swipes the textile with the input indicator in an approaching direction relative to the microphone to decrease volume, and
 a second direction in which the user swipes the textile with the finger in a moving away direction relative to the microphone to decrease volume.

20. The computer program product of claim 18, wherein the program instructions further cause the processor to:
detect a tapping operation performed on the portable computing device,
wherein the volume command is further based on detecting the tapping command.

* * * * *